(12) United States Patent
Oakland

(10) Patent No.: US 7,456,674 B2
(45) Date of Patent: Nov. 25, 2008

(54) CLOCK GENERATOR HAVING IMPROVED DESKEWER

(75) Inventor: Steven F. Oakland, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/027,467

(22) Filed: Feb. 7, 2008

(65) Prior Publication Data
US 2008/0122515 A1 May 29, 2008

Related U.S. Application Data

(62) Division of application No. 11/276,408, filed on Feb. 28, 2006.

(51) Int. Cl.
*G06F 1/04* (2006.01)
(52) U.S. Cl. .................. 327/291; 327/294; 327/299
(58) Field of Classification Search ......... 327/291–294, 327/299, 407, 408, 99, 165, 166
See application file for complete search history.

(56) References Cited

U.S. PATENT DOCUMENTS

| | | | |
|---|---|---|---|
| 5,467,464 A | 11/1995 | Oprescu et al. | |
| 5,517,109 A | 5/1996 | Albean et al. | |
| 5,627,795 A | 5/1997 | Nitta | |
| 6,060,939 A | 5/2000 | Woeste et al. | |
| 6,114,891 A | 9/2000 | Kim | |
| 6,300,809 B1 | 10/2001 | Gregor et al. | |
| 6,329,861 B1 * | 12/2001 | Francis | 327/291 |
| 6,362,680 B1 | 3/2002 | Barnes | |
| 6,496,050 B2 | 12/2002 | Lloyd | |
| 6,507,230 B1 | 1/2003 | Milton | |
| 6,651,181 B1 | 11/2003 | Lacey | |
| 6,651,231 B2 | 11/2003 | Morikawa | |
| 6,731,142 B1 | 5/2004 | Wang et al. | |

(Continued)

OTHER PUBLICATIONS

Garcia, E., "Self-Priming Synchronizing Queue With Deskewi Input Buffer," IBM Technical Disclosure Bulletin, Oct. 1993, pp. 341-342.

(Continued)

*Primary Examiner*—Lincoln Donovan
*Assistant Examiner*—Hai L. Nguyen
(74) *Attorney, Agent, or Firm*—Gibb & Rahman, LLC; Michael LeStrange, Esq.

(57) ABSTRACT

Disclosed is a clock generation circuit for generating a clock-out signal that has a fixed latency with respect to a clock-input signal. When multiple such clock generation circuits are utilized to feed clock signals to different digital logic circuits within an integrated circuit structure, differences in delay time, referred to as skew, are minimized. An embodiment of the clock generation circuit incorporates a waveform generator and a timing-improved deskewer. The waveform generator is clocked by a clock-in signal. The deskewer comprises a flip-flop, a level-sensitive latch, and a multiplexer. The flip-flop and latch are connected in parallel and each receives waveform signals from the waveform generator as well as the clock-in signal in order to generate output signals. The multiplexer gates the flip-flop and latch output signals with the clock-in signal in order to generate the clock-out signal. A testable deskewer for edge-sensitive multiplexer scan designs is also disclosed.

15 Claims, 7 Drawing Sheets

U.S. PATENT DOCUMENTS

| | | |
|---|---|---|
| 6,754,861 B2 | 6/2004 | Reichle et al. |
| 6,861,886 B1 * | 3/2005 | Ludden et al. ............... 327/156 |
| 6,943,605 B2 | 9/2005 | Thadikaran et al. |
| 7,135,899 B1 | 11/2006 | Sancheti et al. |
| 7,240,266 B2 * | 7/2007 | Farmer et al. ............... 714/731 |
| 7,242,235 B1 | 7/2007 | Nguyen |
| 2002/0084823 A1 | 7/2002 | Darmon et al. |
| 2004/0170240 A1 | 9/2004 | Radjassamy |

OTHER PUBLICATIONS

Georgiou, GJ Lee, "Bus Deskewing Method Using a Self-Adjusting Variable Delay Element," IBM Technical Disclosure Bulletin, Oct. 1994, pp. 499-500.

Vallet, et al., "Sample Selection and Data Alignment Circuit," IBM Dossier FR20010012, Oct. 26, 2001, 3 pages.

* cited by examiner

CLOCK GENERATOR HAVING IMPROVED DESKEWER

CROSS REFERENCE TO RELATED APPLICATIONS

This application is a divisional of U.S. application Ser. No. 11/276,408 filed Feb. 28, 2006, the complete disclosure of which, in its entirety, is herein incorporated by reference

BACKGROUND

1. Field of the Invention

The embodiments of the invention generally relate to clock generation circuits and, more particularly, to a clock generation circuit having an improved deskewer.

2. Description of the Related Art

Clock circuits provide precise timing so that digital circuits can function properly. They do so by generating a series of high and low pulses. These high and low pulses are typically generated at a fixed frequency that is measured by the number of high and low transitions that occur per second. The transitions are used as reference for critical actions executed within digital circuits. For example, as discussed by Milton in U.S. Pat. No. 6,507,230, Jan. 14, 2003 (incorporated herein by reference and referred to hereinafter as Milton) clock signals are utilized to synchronize bus cycles of digital logic circuits. Thus, digital logic circuits initiate data operations based on clock signals and, specifically, change their output states in conjunction with the rising and/or falling edge of clock signals.

Also, as discussed in Milton, when multiple clock generators are utilized to feed clock signals to different digital logic circuits within an integrated circuit structure, a difference in delay time, referred to as skew, may occur among the clock signal inputs to the various digital logic circuits. Therefore, Milton discloses a clock generator that provides for reduced clock skews by incorporating a deskewer into each of the clock generators. However, there remains a need in the art for clock generator that provides improved timing and testability.

SUMMARY

In view of the foregoing, embodiments of the invention provide an integrated circuit device comprising a clock generation circuit that incorporates a timing-improved deskewer and either a waveform generator or a finite state machine. Additional embodiments of the invention further improve upon this clock generation circuit by configuring the improved deskewer so that it is testable.

More particularly, one embodiment of the invention comprises a waveform generator and an improved deskewer. Both the waveform generator and the deskewer are adapted to receive a first clock signal (i.e., a "clock in" signal). The waveform generator clocked by this first clock signal is further adapted to generate a waveform signal and to output the generated waveform signal to the deskewer circuit. The deskewer circuit is further adapted to receive the waveform signal and to gate the waveform signal with the first clock signal in order to generate a second clock signal that is synchronized to the first clock signal.

Specifically, the deskewer circuit comprises a flip-flop, a latch (e.g., a level-sensitive latch) and a multiplexer. The first clock signal (i.e., the "clock-in" signal) is split such that it is input into each of these components. The waveform signal from the waveform generator is split such that it is input into both the flip-flop and the latch, which are arranged in parallel between the waveform generator and the multiplexer. Thus, both the flip-flop and latch receive the waveform signal and the first clock signal. The flip-flop processes these signals to output a first output signal and the latch processes these signals to output a second output signal. The multiplexer then receives the outputs from the flip-flop and latch (i.e., the first and second output signals, respectively) as well as the first clock signal. The multiplexer is adapted to gate the first output signal, the second output signal and the first clock signal in order to generate the second clock signal. For example, the multiplexer can comprise a plurality of logic circuits such as 3 two-input AND gates and a three-input OR gate that have a Boolean expression of (a AND NOT c) OR (c AND b) OR (b AND a), where a comprises the first output signal, b comprises the second output signal and c comprises the first clock signal.

Similarly, another embodiment of the invention comprises a finite state machine and an improved deskewer. Both the finite state machine and the deskewer are adapted to receive a first clock signal (i.e., a "clock in" signal). The finite state machine clocked by this first clock signal is further adapted to generate two waveform signals (i.e., a first waveform signal and a second waveform signal) and to output these waveform signals to the deskewer circuit. The deskewer circuit is further adapted to receive these waveform signals and to gate the waveform signals with the first clock signal in order to generate a second clock signal that is synchronized to the first clock signal.

Specifically, the deskewer circuit comprises a flip-flop, a latch (e.g., a level-sensitive latch) and a multiplexer. The flip-flop and latch are arranged in parallel between the finite state machine and the multiplexer. The first clock signal (i.e., the "clock-in" signal) is split such that it is input into each of these components. The first waveform signal from the finite state machine is input into the flip-flop, which processes the first waveform signal and the first clock signal to output a first output signal. The second waveform signal from the finite state machine is input into the latch, which processes the second waveform signal and the first clock signal to output a second output signal. The multiplexer then receives the outputs from the flip-flop and latch (i.e., the first and second output signals, respectively) as well as the first clock signal. The multiplexer is adapted to gate the first output signal, the second output signal and the first clock signal in order to generate the second clock signal. For example, the multiplexer can comprise a plurality of logic circuits such as 3 two-input AND gates and a three-input OR gate that have a Boolean expression of (a AND NOT c) OR (c AND b) OR (b AND a), where a comprises the first output signal, b comprises the second output signal and c comprises the first clock signal.

The clock generation circuits, described above, can each be incorporated into various types of integrated circuit devices. For example, a clock generation circuit, according to the invention, can be incorporated into an integrated circuit device with a level-sensitive scan design that is clocked by the second clock signal. Alternatively, the clock generation circuit, according to the invention, can comprise an additional multiplexer so that it may be incorporated into an integrated circuit device with an edge-sensitive multiplexer scan design. Specifically, the additional multiplexer can be adapted to receive the second clock signal and to gate the second clock signal with a test mode input signal and a test clock input signal in order to generate a third clock signal for clocking the edge-sensitive multiplexer scan design.

Additional embodiments of the invention further improve upon the clock generation circuits, as described above, by configuring the improved deskewers to be testable (i.e., a testable deskewer). The testable deskewer comprises the flip-flop, latch and multiplexer, described above, and also comprises an AND gate disposed between the flip-flop and the multiplexer. This AND gate is adapted to receive the first output signal from the flip-flop as well as a test mode signal from a test mode pin. The AND gate couples the first output signal and the test mode signal to generate a third output signal. Thus, instead of gating the first and second output signals with the first clock signal, the multiplexer gates the third output signal, the second output signal, and the first clock signal in order to generate the second clock signal. Thus, during testing, the test mode signal can be set low to force the second clock signal low when the first clock is low.

The testable deskewer can further comprise the following additional features: (1) a scan-path multiplexer disposed between the waveform generator (or the finite state machine, depending upon the embodiment) and the flip-flop; (2) a Test Scan Enable pin for controlling the scan-path multiplexer; (3) Scan in and Scan out pins for inserting the mux-DFF (into a scan path; (4) an OR gate inserted either before the D input of the latch or after the L output for ensuring that the clock-on state (1) can propagate (from CLOCK IN to CLOCK OUT) when required, such as when scanning downstream flip-flops; and (5) a Test Clock Enable pin connected to one of the OR-gate input. More particularly, the testable deskewer can comprise a second multiplexer and an OR gate. The second multiplexer can be connected between the waveform generator (or finite state machine, depending upon the embodiment) and the flip-flop. The OR gate can be connected between the waveform generator (or the finite state machine, depending upon the embodiment) and the latch. Alternatively, the OR gate can be connected between the latch and the multiplexer. The second multiplexer can be adapted to gate a scan-in signal with both the waveform signal from the waveform generator (or the first waveform signal of the finite state machine, depending upon the embodiment) and a test scan enable signal. The purpose of the OR gate is to receive a test clock enable signal in order to override all other gating. Thus, the clock generation circuit with the testable deskewer may be readily incorporated into an integrated circuit device with an edge-sensitive multiplexer scan design clocked without the required addition of another multiplexer for generating a third clock signal.

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION OF PREFERRED EMBODIMENTS

Figure 1:
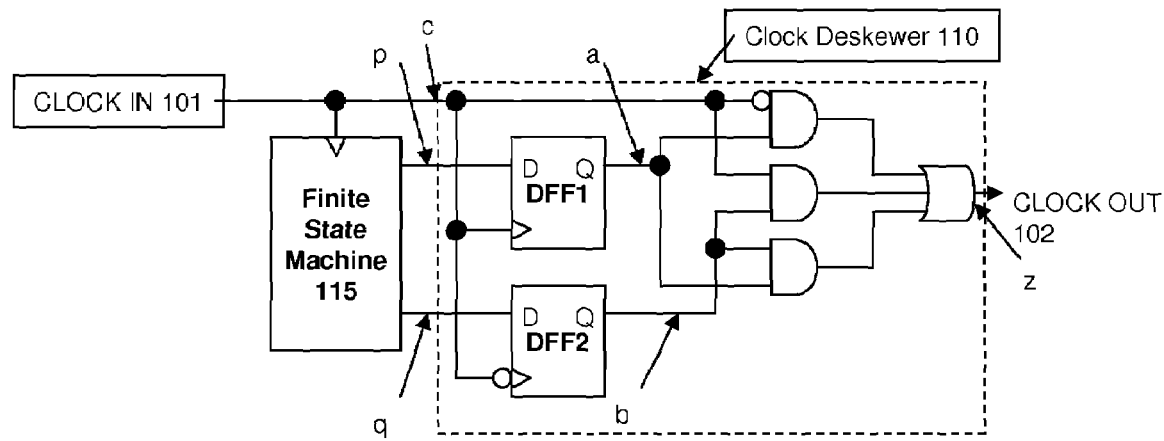
FIG. 1 illustrates a schematic diagram of a clock generation circuit with a finite state machine and deskewer.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned above, clock circuits provide precise timing so that digital circuits can function properly. They do so by generating a series of high and low pulses. These high and low pulses are typically generated at a fixed frequency that is measured by the number of high and low transitions that occur per second. The transitions are used as reference for critical actions executed within digital circuits. For example, as discussed by Milton in U.S. Pat. No. 6,507,230, Jan. 14, 2003 (incorporated herein by reference and referred to hereinafter as Milton) clock signals are utilized to synchronize bus cycles of digital logic circuits. Thus, digital logic circuits initiate data operations based on clock signals and, specifically, change their output states in conjunction with the rising and/or falling edge of clock signals.

Figure 2:
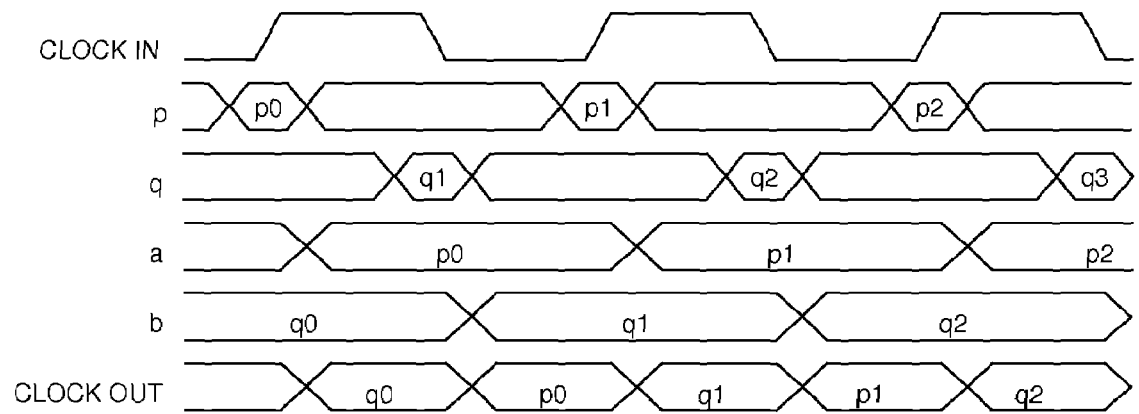
FIG. 2 is a chart illustrating exemplary waveform transitions exhibited by the circuit of FIG. 1.

Also, as discussed in Milton, when multiple clock generators are utilized to feed clock signals to different digital logic circuits within an integrated circuit structure, a difference in delay time, referred to as skew, may occur among the clock signal inputs to the various digital logic circuits. Therefore, Milton discloses a clock generator that provides for reduced clock skews by incorporating a finite state machine (or a waveform generator, depending upon the embodiment) and a deskewer. For example, referring to FIG. 1, in one embodiment of Milton, the clock deskewer 110 provides minimal latency from CLOCK IN 101 to CLOCK OUT 102, whereby the output waveform z is determined by inputs p and q from a finite state machine 115 clocked by the input clock (CLOCK IN 101). In a simple case, p is tied low and q is tied high, resulting in an output clock 102 that is equal to the input clock 101. In another simple case, p is tied high and q is tied low, resulting in an output clock that is inverted from the input clock. By designing appropriate finite state machine 115 logic, it is possible to create a clock waveform that transitions only when the input clock transitions. The circuit is useful in integrated circuit designs with multiple clock domains whereby two or more domains have a phase relationship to each other because the two clocks can be generated from the same clock source using two instances of the clock deskewer with two different finite state machines. However, the invention of Milton is limited. The chart of FIG. 2 illustrates the timing limitation of Milton. Specifically, the deskewer 110 inputs p and q have different timing requirements. Input p must satisfy setup and hold criteria with respect to the rising edge of the clock, whereas input q must satisfy setup and hold criteria with respect to the falling edge of the clock. In a typical finite state machine design using rising-edge-triggered flip-flops, outputs p and q change state some time after the rising edge of the clock and remain stable until after the next rising edge. In high-speed applications, the delay from the rising clock edge until output q changes state may be so large that it is impossible to meet the setup requirement. Therefore, there remains a need in the art for clock generator that provides improved timing—specifically, a relaxed setup requirement.

In view of the foregoing, embodiments of the invention provide an integrated circuit device comprising a clock generation circuit that incorporates a timing-improved deskewer and either a waveform generator or a finite state machine. Additional embodiments of the invention further improve upon this clock generation circuit by configuring the improved deskewer so that it is testable.

Figure 3:
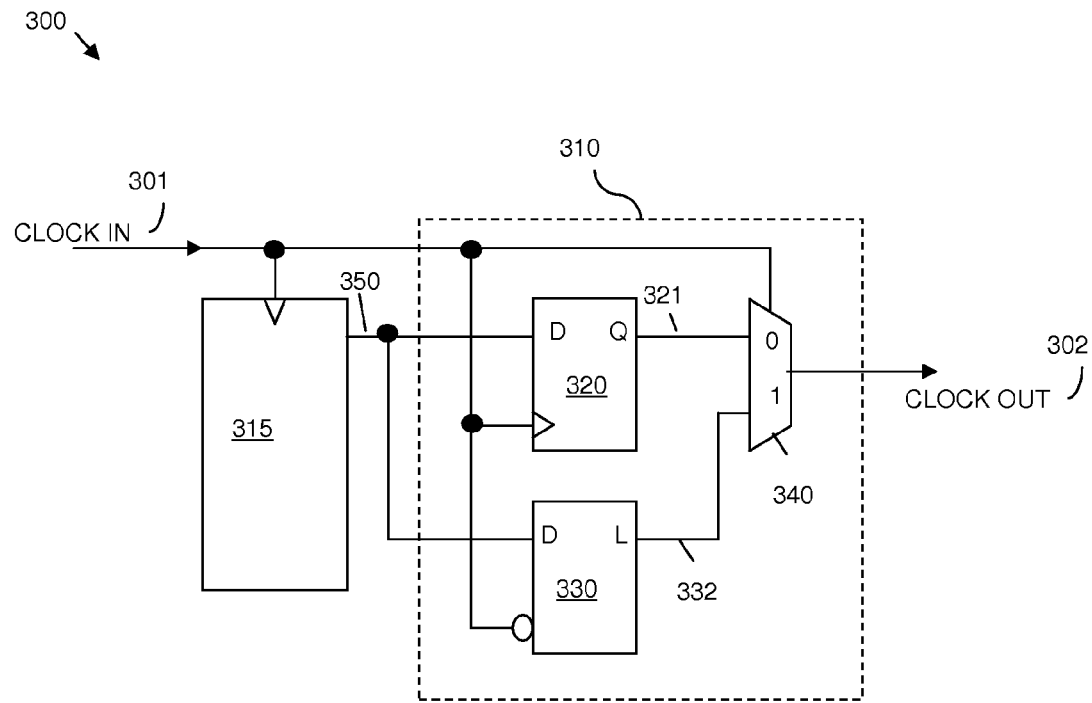
FIG. 3 illustrates a schematic diagram of an embodiment of the clock generation circuit of the invention with a waveform generator and improved deskewer.

More particularly, referring to FIG. 3, one embodiment of the invention comprises a clock generation circuit 300 comprising a waveform generator 315 and an improved deskewer 310. Both the waveform generator 315 and the deskewer 310 are adapted to receive a first clock signal 301 (i.e., a "clock in" signal). The waveform generator 315 may be implemented by any suitable waveform generator circuit known in the art. The waveform generator 315 clocked by this first clock signal 301 is further adapted to generate a waveform signal 350 and to output the generated waveform signal 350 to the deskewer circuit 310. The deskewer circuit 310 is further adapted to receive the waveform signal 350 and to gate the waveform signal 350 with the first clock signal 301 in order to generate a second clock signal 302 that is synchronously linked to the first clock signal (e.g., so that it has a fixed latency with respect to the clock-input signal). When multiple such clock generation circuits are utilized to feed clock signals to different digital logic circuits within an integrated circuit structure, differences in delay time, referred to as skew, are minimized.

Specifically, the deskewer 310 delays the waveform signal 350 for one clock cycle in accordance with the clock cycle of the clock-in signal 301 so that the clock-out signal 302 is closely timed with respect to the clock-in signal 301. More specifically, the deskewer circuit 310 comprises a flip-flop 320, a latch 330 (e.g., a level-sensitive latch) and a multiplexer 340. The first clock signal 301 (i.e., the "clock-in" signal) is split such that it is input into each of these components 320, 330, 340. The waveform signal 350 from the waveform generator 315 is split such that it is input into both the flip-flop 320 and the latch 330, which are arranged in parallel between the waveform generator 315 and the multiplexer 340. Thus, both the flip-flop 320 and latch 330 receive the waveform signal 350 and the first clock signal 301. The flip-flop 320 processes these signals to output a first output signal 321 and the latch 330 processes these signals to output a second output signal 332.

Figure 4:
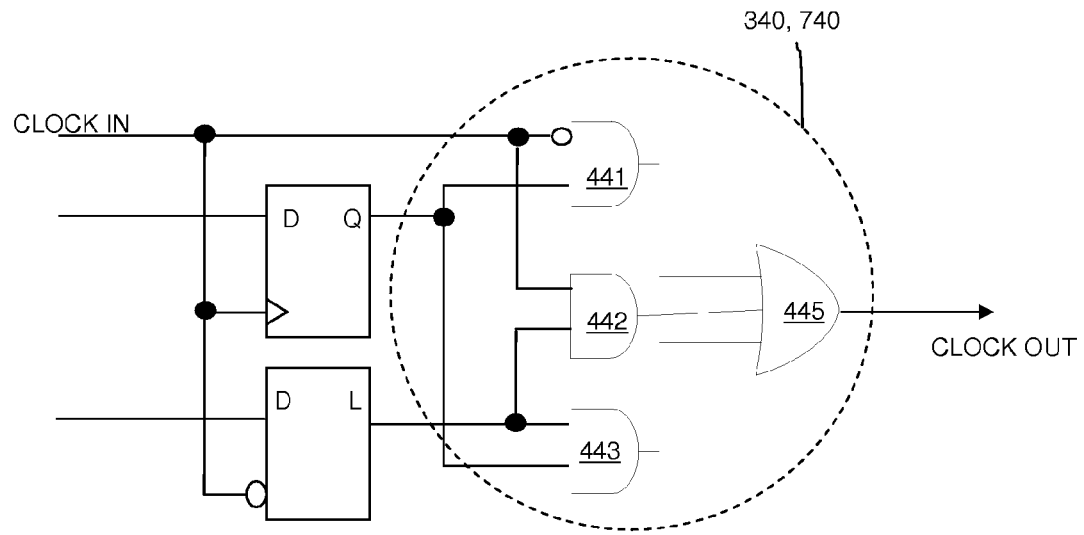
FIG. 4 illustrates a schematic diagram of an exemplary multiplexer that may be incorporated into the clock generation circuits 300 and 700 of FIGS. 3 and 7.

The multiplexer 340 then receives the outputs 321, 332 from the flip-flop 320 and latch 330 (i.e., the first and second output signals 321, 332, respectively) as well as the first clock signal 301. The multiplexer 340 is adapted to gate the first output signal 321, the second output signal 332 and the first clock signal 301 in order to generate the second clock signal 302. Note also that the output multiplexer 340 has been re-drawn (compared to FIG. 1) as a single block, indicating that the deskewer function is not dependent upon the implementation of the multiplexer, provided that the multiplexer is "glitch-free." However, referring to FIG. 4, an exemplary multiplexer 340 can, as in FIG. 1, comprise a plurality of logic circuits 441-445 such as 3 two-input AND gates 441-443 and a three-input OR gate 445 that have a Boolean expression of (a AND NOT c) OR (c AND b) OR (b AND a), where a comprises the first output signal 321, b comprises the second output signal 332 and c comprises the first clock signal 301.

Figure 5:
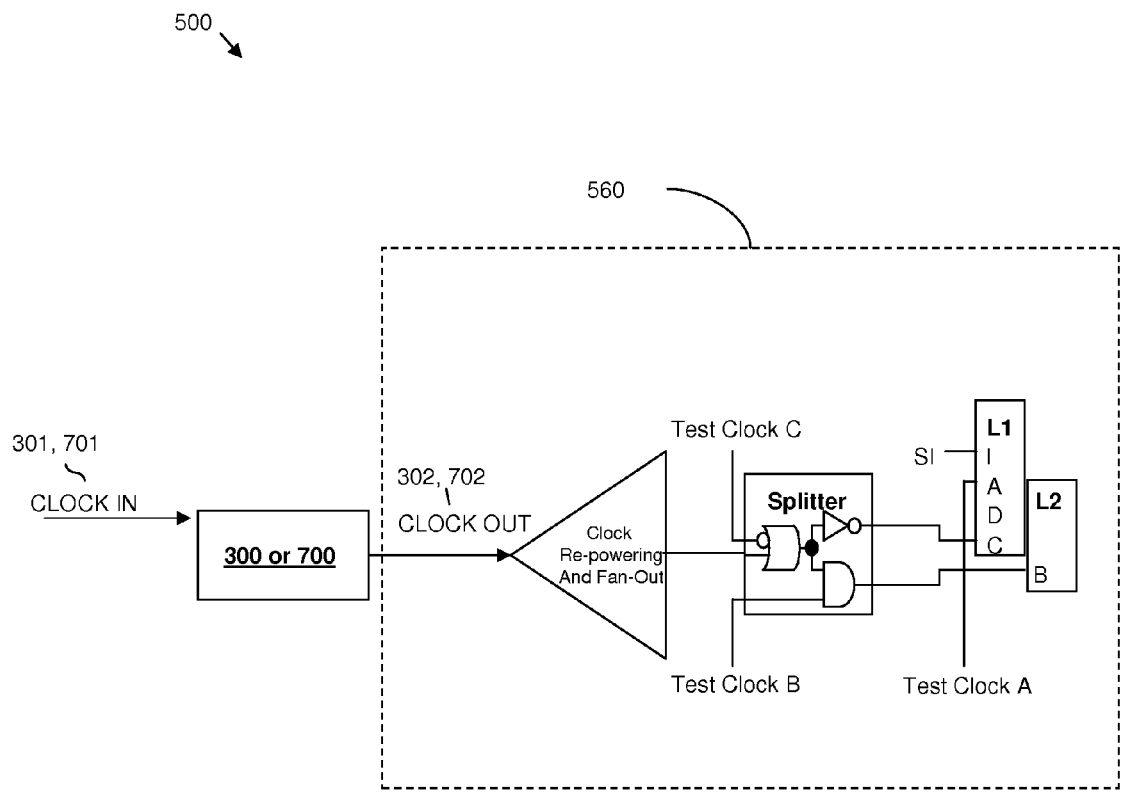
FIG. 5 illustrates a schematic diagram of an embodiment of the clock generation circuit of FIGS. 3 and 7 incorporated into an integrated circuit device with a level-sensitive scan design.

The clock generation circuit 300, described above, can be incorporated into various types of integrated circuit devices. For example, referring to FIG. 5, the clock generation circuit 300 can be incorporated into an integrated circuit device 500 with a level-sensitive scan design 560 that is clocked by the second clock signal 302. Specifically, FIG. 5 illustrates an integrated circuit device 500 in which clock generation circuit 300 is used in a typical level-sensitive scan design 560, such as an application-specific integrated circuit (ASIC). The source of CLOCK IN 301 may be a clock primary input, but is more typically the output of a phase-locked loop (PLL). At the right, a shift-register latch (SRL) pair is used to implement each rising-edge-triggered flip-flop in ASIC. A clock splitter at the leaf of the clock re-powering/fan-out tree splits the clock into two complementary phases and re-drives the clock to several SRLs. An ASIC with several tens of thousands of SRLs will have several thousands of splitters for splitting and re-powering the clock. For level-sensitive scan-based testing, the SRLs are connected into scan chains by connecting the output of each SRL to the I (scan in) pin of another. Test patterns are scanned through the SRLs by holding Test Clock C low while alternately pulsing Test Clock A and Test Clock B. When capturing the response of a test vector, Test Clocks A and B are typically held low while Test Clock C is pulsed. Assuming that CLOCK IN 301 is controllable during test, the clock generation logic (i.e., the waveform generator 315, deskewer 310, and re-powering circuits) are statically tested because the generated clock gates the propagation of Test Clock C.

Figure 6:
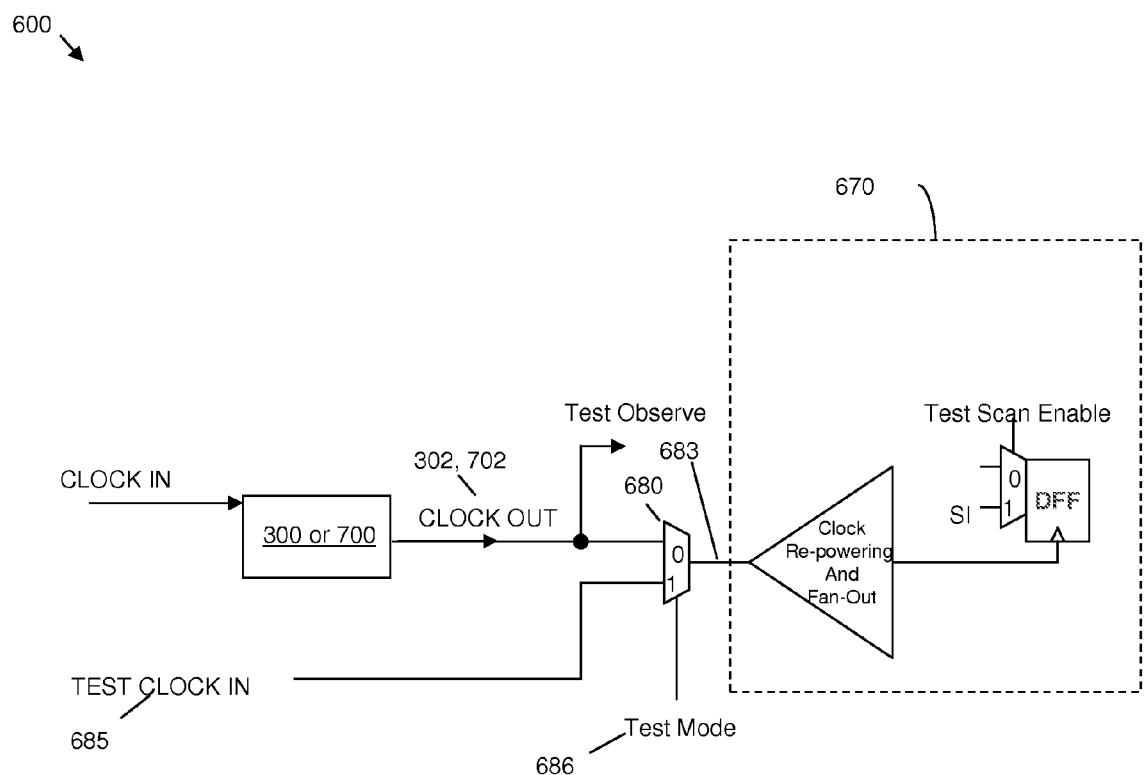
FIG. 6 illustrates a schematic diagram of an embodiment of the clock generation circuit of FIG. 3 or 7 incorporated into an integrated circuit device with an edge-sensitive MUX-scan design.
Figure 9:
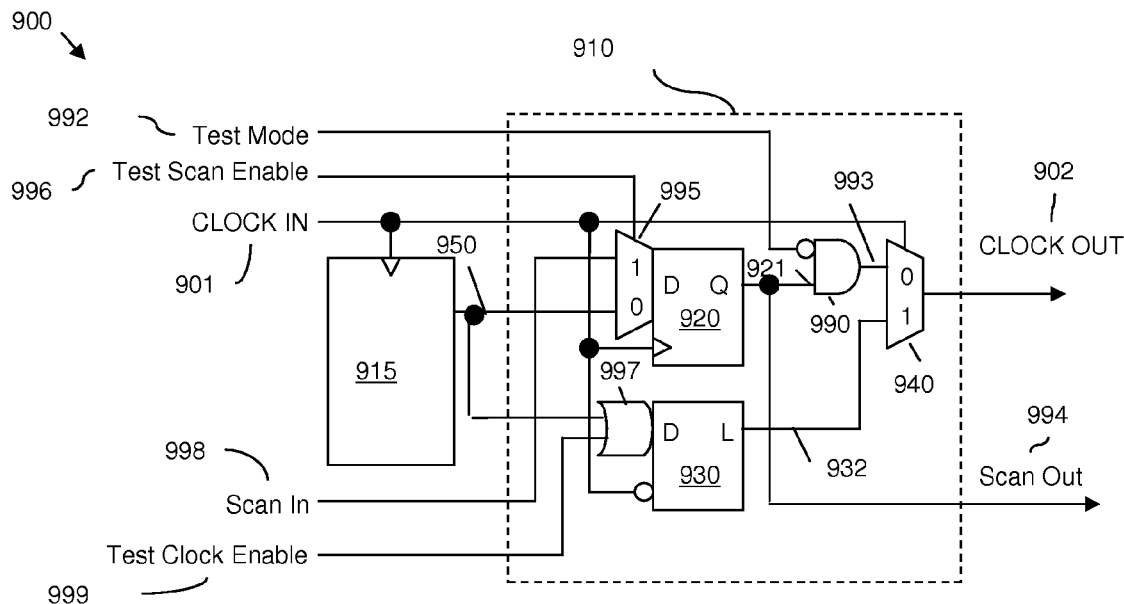
FIG. 9 illustrates a schematic diagram of an embodiment of the clock generation circuit of the invention with a testable deskewer.
Figure 10:
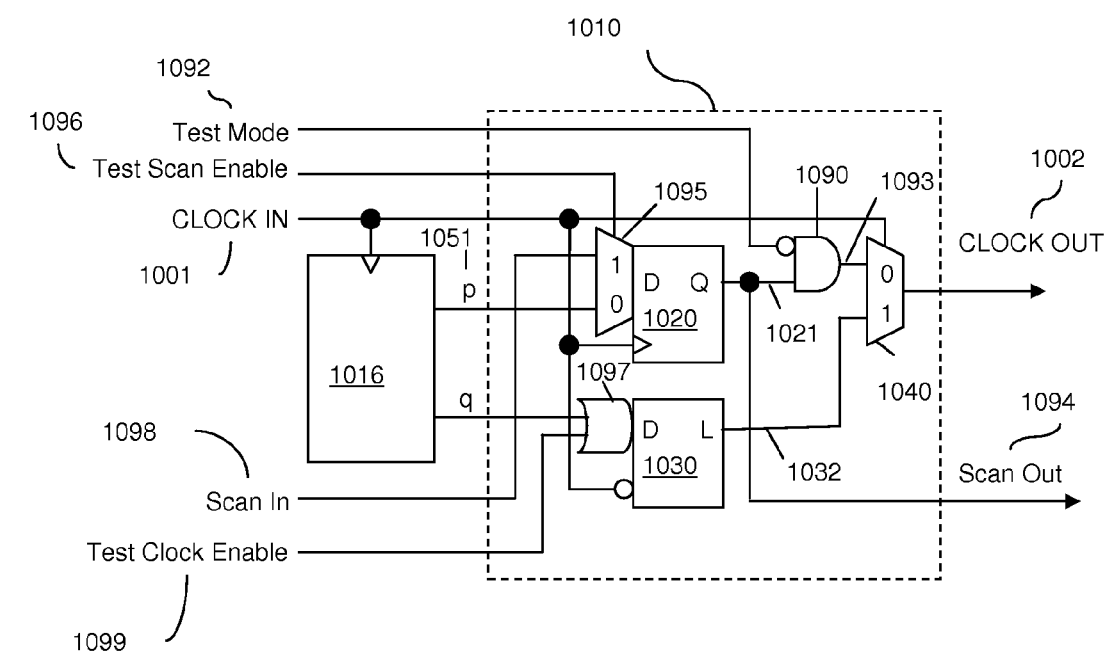
FIG. 10 illustrates a schematic diagram of another embodiment of the clock generation circuit of the invention with a testable deskewer.

Alternatively, referring to FIG. 6, the clock generation circuit 300 can further comprise another multiplexer 680 adapted to gate the second clock signal 302 and a test clock input signal 685 in order to generate a third clock signal 683 so that this third clock signal 683 can be used to clock an integrated circuit device 600 with an edge-sensitive multiplexer scan design 670. Specifically, FIG. 6 illustrates an integrated circuit device 600 with a typical edge-sensitive mux-scan design 670. At the right, a mux-DFF is used to implement each rising-edge-triggered flip-flop in the design. For scan-based testing, the mux-DFFs are connected into scan chains by connecting the output of each mux-DFF to the scan in pin (SI) of another. Test patterns are scanned through the mux-DFFs by holding Test Scan Enable high while pulsing clock signal 683. When capturing the response of a test vector, Test Scan Enable is held low while pulsing the clock. Since clock signal 683 is not a primary input to the chip, a test clock 685 is muxed into the clock, typically at the root of the clock tree. Because the output 302 of the deskewer 310 of the clock generation circuit 300 is not a direct function of its clock input 301, the test clock 685 must be multiplexed into the clock distribution after the deskewer 310. The additional clock multiplexer 680 is controlled by a Test Mode signal 686 which is active for all scan-based tests of the design. Because the deskewer output 302 is blocked by the test-clock multiplexer 680, test observation logic must be inserted if the deskewer 310 is to be tested. A disadvantage of this configuration is that the test-clock multiplexer 680 may add latency to the clock distribution network. As a result, the uncertainty of the clock arrival time at the flip-flops in the edge-sensitive MUX scan design 670 is increased. One solution is to incorporate the test-clock multiplexer into the root-stage driver(s) of the clock re-powering and fan-out network. Another solution, discussed in greater detail below with regard to FIGS. 9 and 10, is to incorporate the test-clock multiplexing function into the deskewer circuit 310.

Figure 7:
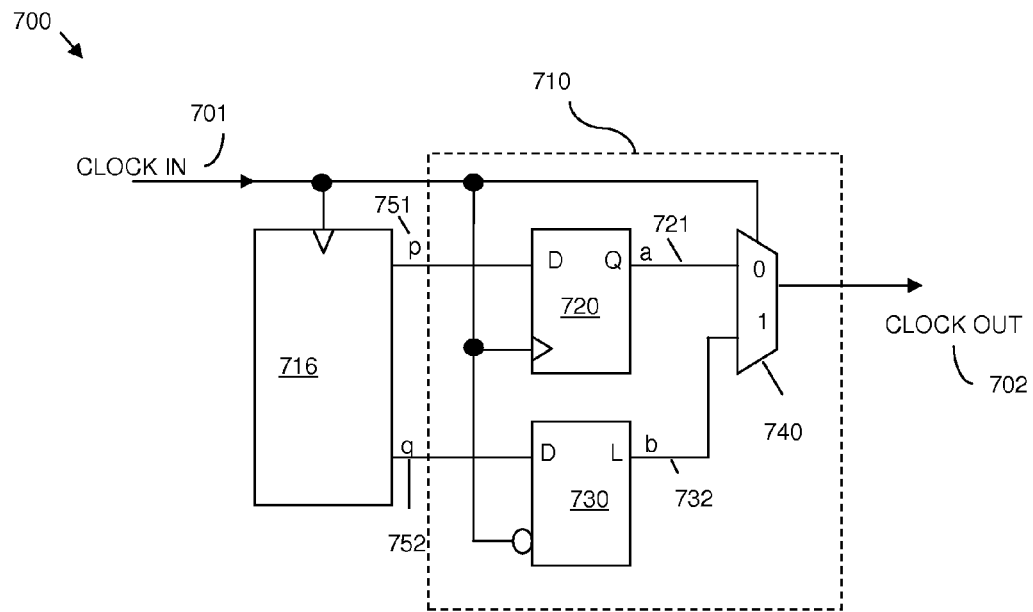
FIG. 7 illustrates a schematic diagram of another embodiment of the clock generation circuit of the invention with a finite state machine and improved deskewer.
Figure 8:
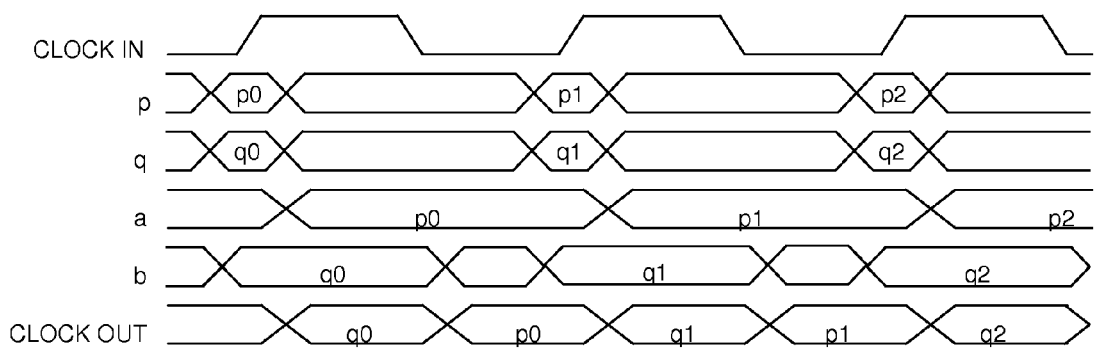
FIG. 8 is a chart illustrating exemplary waveform transitions exhibited by the circuit of FIG. 7.

Referring to FIG. 7, another embodiment of the invention comprises a clock generation circuit 700 similar to the clock generation circuit 300 but comprising a finite state machine 716 as opposed to a waveform generator. Both the finite state machine 716 and the improved deskewer 710 of clock generation circuit 700 are adapted to receive a first clock signal 701 (i.e., a "clock in" signal).

The finite state machine 716 may be implemented by any suitable finite state machine known in the art. The finite state machine 716 clocked by this first clock signal 701 is adapted to generate two waveform signals (i.e., a first waveform signal 751 (p) and a second waveform signal 752 (q)) and to output these waveform signals 751, 752 to the deskewer circuit 710. Specifically, the finite state machine 716 is configured to operate at a 1× clock frequency to separately encode information on two outputs p (i.e., first waveform signal 751) and q (i.e., second waveform signal 752). This enables the circuit to propagate two clock edges for every clock cycle (e.g., first waveform signal 751 at the first half of the clock cycle and second waveform signal 752 at the second half of the same clock cycle).

The deskewer circuit 710 is adapted to receive these waveform signals 751, 752 and to gate the waveform signals 751, 752 with the first clock signal 701 in order to generate a second clock signal 702 that is synchronously linked to the first clock signal (e.g., so that it has a fixed latency with respect to the clock-input signal). When multiple such clock generation circuits are utilized to feed clock signals to different digital logic circuits within an integrated circuit structure, differences in delay time, referred to as skew, are minimized. The deskewer circuit 710 delays each of these waveform signals 751 and 752 for one clock cycle, according to the clock cycle of the clock-in signal 701 so that the clock-out signal 702 is closely timed with respect to the clock-in signal 701. To do so, the deskewer circuit comprises a flip-flop 720, a latch 730 (e.g., a level-sensitive latch) and a multiplexer 740. The flip-flop 720 and latch 730 are arranged in parallel between the finite state machine 716 and the multiplexer 740. The first clock signal 701 (i.e., the "clock-in" signal) is split such that it is input into each of these components 720, 730, 740. The first waveform signal 751 from the finite state machine 716 is input into the flip-flop 720, which processes the first waveform signal 751 and the first clock signal 701 to output a first output signal 721 (a). The second waveform signal 752 from the finite state machine 716 is input into the latch 730, which processes the second waveform signal 752 and the first clock signal 701 to output a second output signal 732 (b). By changing the second flip-flop (DFF2) of FIG. 1 to a single, level-sensitive latch 730, the setup and hold requirements for both p (751) and q (752) are with respect to the rising edge of the clock. Thus, comparing FIG. 2 to FIG. 8, by using the latch 730 in the deskewer 710 as opposed to a second flip-flop, the input q (752) is allowed to arrive a half cycle later.

The multiplexer 740 then receives the outputs from the flip-flop 720 and latch 730 (i.e., the first and second output signals 721, 732, respectively) as well as the first clock signal 701. The multiplexer 740 is adapted to gate the first output signal 721, the second output signal 732 and the first clock signal 701 in order to generate the second clock signal 702. Note also that the output multiplexer 740 has been re-drawn (compared to FIG. 1) as a single block, indicating that the deskewer function is not dependent upon the implementation of the multiplexer, provided that the multiplexer is "glitch-free." However, referring to FIG. 4, an exemplary multiplexer 740 can, as in FIG. 1, comprise a plurality of logic circuits 441-445 such as 3 two-input AND gates 441-443 and a three-input OR gate 445 that have a Boolean expression of (a AND NOT c) OR (c AND b) OR (b AND a), where a comprises the first output signal 721, b comprises the second output signal 732 and c comprises the first clock signal 701.

As with the clock generation circuit 300, the clock generation circuit 700 can be incorporated into various types of integrated circuit devices. For example, referring to FIG. 5, the clock generation circuit 700 can be incorporated into an integrated circuit device 500 with a level-sensitive scan design 560 that is clocked by the second clock signal 702. Specifically, FIG. 5 illustrates an integrated circuit device 500 in which clock generation circuit 700 is used in a typical level-sensitive scan design 560, such as an application-specific integrated circuit (ASIC). The source of CLOCK IN 701 may be a clock primary input, but is more typically the output of a phase-locked loop (PLL). At the right, a shift-register latch (SRL) pair is used to implement each rising-edge-triggered flip-flop in ASIC. A clock splitter at the leaf of the clock re-powering/fan-out tree splits the clock into two complementary phases and re-drives the clock to several SRLs. An ASIC with several tens of thousands of SRLs will have several thousands of splitters for splitting and re-powering the clock. For level-sensitive scan-based testing, the SRLs are connected into scan chains by connecting the output of each SRL to the I (scan in) pin of another. Test patterns are scanned through the SRLs by holding Test Clock C low while alternately pulsing Test Clock A and Test Clock B. When capturing the response of a test vector, Test Clocks A and B are typically held low while Test Clock C is pulsed. Assuming that CLOCK IN 701 is controllable during test, the clock generation logic (i.e., the finite state machine 716, deskewer 710, and re-powering circuits) are statically tested, because the generated clock gates the propagation of Test Clock C.

Alternatively, referring to FIG. 6, the clock generation circuit 700 can further comprise another multiplexer 680 adapted to gate the second clock signal 702 and a test clock input signal 685 in order to generate a third clock signal 683. So configured the clock generation circuit can be used to clock an integrated circuit device with an edge-sensitive multiplexer scan design 670. Specifically, FIG. 6 illustrates an integrated circuit device 600 with a typical edge-sensitive mux-scan design 670. At the right, a mux-DFF is used to implement each rising-edge-triggered flip-flop in the design. For scan-based testing, the mux-DFFs are connected into scan chains by connecting the output of each mux-DFF to the scan in pin (SI) of another. Test patterns are scanned through the mux-DFFs by holding Test Scan Enable high while pulsing clock signal 683. When capturing the response of a test vector, Test Scan Enable is held low while pulsing the clock. Since clock signal 683 is not a primary input to the chip, a test clock 685 is muxed into the clock, typically at the root of the clock tree. Because the output 702 of the deskewer 710 of the clock generation circuit 700 is not a direct function of its clock input 701, the test clock 685 must be multiplexed into the clock distribution after the deskewer 710. The additional clock multiplexer 680 is controlled by a Test Mode signal 686 which is active for all scan-based tests of the design. Because the deskewer output 702 is blocked by the test-clock multiplexer 680, test observation logic must be inserted if the deskewer 710 is to be tested. A disadvantage of this configuration is that the test-clock multiplexer 680 may add latency to the clock distribution network. As a result, the uncertainty of the clock arrival time at the flip-flops in the edge-sensitive MUX scan design 670 is increased. One solution would be to incorporate the test-clock multiplexer into the root-stage driver(s) of the clock re-powering and fan-out network. Another solution, discussed in greater detail below with regard to FIGS. 9 and 10, is to incorporate the test-clock multiplexing function into the deskewer circuit 710.

Referring to FIGS. 9 and 10, additional embodiments of the invention further improve upon the clock generation circuits 300 and 700 by configuring each of the clock generation circuits 900 and 1000, respectively, with an improved deskewer 910, 1010 that is testable (i.e., a testable deskewer). Specifically, the clock generation circuit 900 of FIG. 9 is similar to clock generation circuit 300 of FIG. 3 in that it comprises the same waveform generator. The clock generation circuit 1000 of FIG. 10 is similar to clock generation circuit 700 of FIG. 7 in that it comprises the same finite state machine 716. Both the clock generation circuits 900 and 1000 comprise a testable deskewer 910, 1010.

As with the deskewers of FIGS. 3 and 7, the testable deskewer 910, 1010 comprises a flip-flop 920, 1020, latch 930, 1030 and multiplexer 940, 1040. The testable deskewer 910, 1010, however, also comprises a two input AND gate 990, 1090 disposed between the flip-flop 920, 1020 and the multiplexer 940, 1040. This AND gate 990, 1090 is adapted to receive the first output signal 921, 1021 from the flip-flop 920, 1020 as well as a test mode signal 992, 1092 from a test mode pin that has been added for forcing the output 902, 1002 to zero during test. This allows the input clock to control downstream flip-flops to their clock-off state during test. Specifically, the AND gate 990, 1090 couples the first output signal 921, 1021 and the test mode signal 992, 1092 to generate a third output signal 993, 1093. Thus, instead of gating the first and second output signals with the first clock signal, the multiplexer 940, 1040 gates the third output signal 993, 1093, the second output signal 932, 1032, and the first clock signal 901, 1001 in order to generate the second clock signal 902, 1002. By setting the test mode signal 992, 1092 and the first clock signal both to low and gating the first output signal 921, 1021 with the test mode signal 992, 1092 the second clock signal 902, 1002 can be forced to low during testing. Additionally, because the afore-mentioned 2-input gate 990, 1090 blocks the propagation of the flip-flop 920, the multiplexer 995, 1095 in combination with the flip-flop 920, 1020 allows its state to be observable via scan.

Referring again to FIGS. 9 and 10, the testable deskewer 910, 1010 can further comprise the following additional features: (1) a multiplexer 995, 1095 disposed between the waveform generator 915 (or the finite state machine 1016, depending upon the embodiment) and the flip-flop 920, 1020; (2) a Test Scan Enable pin 996, 1096 for controlling the scan-path multiplexer; (3) Scan in 998, 1098 and Scan out pins 994, 1094 for inserting the mux-DFF (995-920, 1095-1020) into a scan path; (4) an OR gate 997, 1097 inserted either before the D input of the latch 930, 1030 (as shown) or after the L output (not shown) for ensuring that the clock-on state (1) can propagate (from CLOCK IN 901, 1001 to CLOCK OUT 902, 1002) when required, such as when scanning downstream flip-flops; and (5) a Test Clock Enable pin 999, 1099 connected to one of the OR-gate 997, 1097 inputs (the Test Clock Enable pin 999, 1099 may be combined with either the Test Scan Enable pin 996, 1096 or the Test Mode pin 992, 1092).

Figure 11:
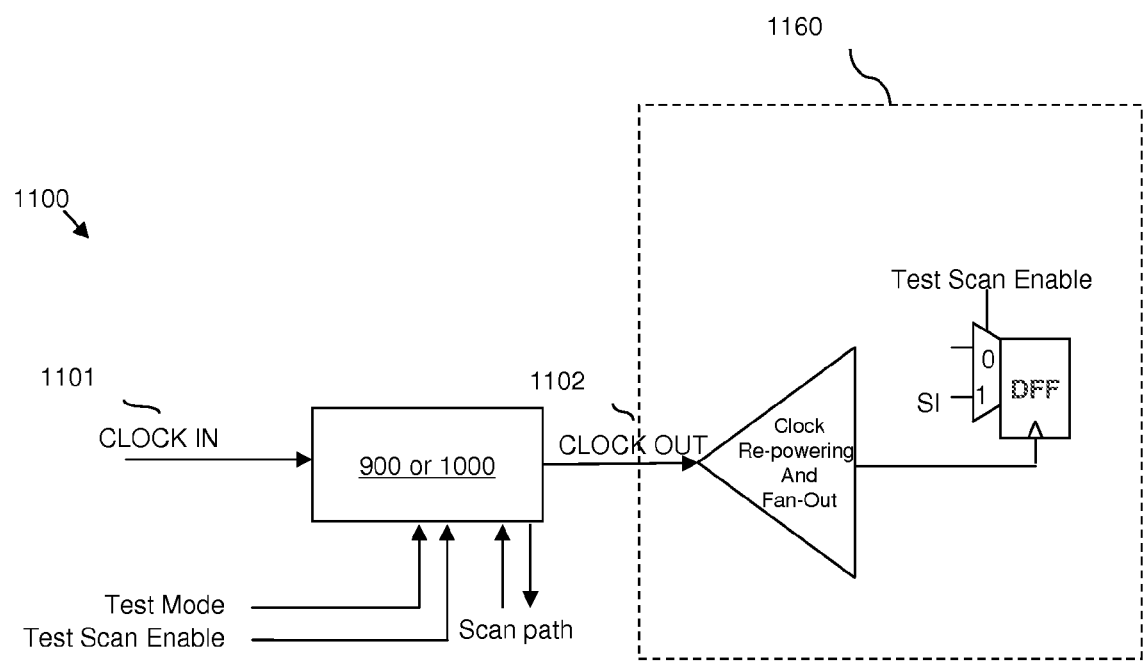
FIG. 11 illustrates a schematic diagram of an embodiment of the clock generation circuit of FIG. 9 or 10 incorporated into an integrated circuit device with an edge-sensitive MUX-scan design.

More particularly, the testable deskewer 910, 1010 can comprise a second multiplexer 995, 1095 and an OR gate 997, 1097. The second multiplexer 995, 1095 can be connected between the waveform generator 915 (or finite state machine 1016, depending upon the embodiment) and the flip-flop 920, 1020. The OR gate 997, 1097 can be connected between the waveform generator 915 (or the finite state machine 1016, depending upon the embodiment) and the latch 930, 1030 (as shown in FIGS. 9 and 10). Alternatively, the OR gate 997, 1097 can be connected between the latch 930, 1030 and the multiplexer 940, 1040 (not shown). The second multiplexer 995, 1095 can be adapted to gate a scan-in signal 998 (i.e., a scan input signal), 1098 with both the waveform signal 950 from the waveform generator 915 (or the first waveform signal 1051 of the finite state machine 1016, depending upon the embodiment) and a test scan enable signal 996, 1096. The purpose of the OR gate is to receive a test clock enable signal 999, 1099 in order to override all other gating. Thus, referring to FIG. 11, the clock generation circuit 900, 1000 with the testable deskewer may be readily incorporated into an integrated circuit device 1100 with an edge-sensitive multiplexer scan design 1160 clocked without the required addition of another multiplexer for generating a third clock signal (as required when the deskewer is not testable). Note that the test-clock multiplexer (and its associated latency) has been removed from the clock path. Note also that the functional clock, CLOCK IN, can be used as the test clock, provided that CLOCK IN is controllable from a primary input. Thus, the edge-sensitive multiplexer scan design 1160 can be clocked with the second clock signal 1102.

Therefore, disclosed above are embodiments of an integrated circuit device that comprises a clock generation circuit for generating a clock-out signal that is synchronized to a clock-in signal. When multiple such clock generation circuits are utilized to feed clock signals to different digital logic circuits within an integrated circuit structure, differences in delay time, referred to as skew, are minimized. Specifically, the clock generation circuit incorporates a waveform generator (or finite state machine) and a timing-improved deskewer. The waveform generator (or finite state machine) is clocked by the clock-in signal. The timing-improved deskewer incorporates a flip-flop, a level-sensitive latch, and a multiplexer. The flip-flop and latch are connected in parallel and each receives waveform signals from the waveform generator (or finite state machine) as well as the clock-in signal in order to generate output signals. The multiplexer gates the flip-flop and latch output signals with the clock-in signal in order to generate the clock-out signal. By using a latch as opposed to a second flip-flop, the improved deskewer allows the latch input q to arrive a half cycle later. Additional embodiments of the invention further improve upon this clock generation circuit by configuring the improved deskewer so that it is testable and can, thus, be readily incorporated into an edge-sensitive multiplexer scan design.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments of the invention have been described in terms of embodiments, those skilled in the art will recognize that the embodiments of the invention can be practiced with modification within the spirit and scope of the appended claims.

What is claimed is:

1. An integrated circuit device comprising:
  a waveform generator adapted to generate a waveform signal, wherein said waveform generator is clocked by a first clock signal; and
  a deskewer circuit adapted to receive and gate said first clock signal and said waveform signal so as to generate a second clock signal such that said second clock signal is synchronously linked to said first clock signal, wherein said deskewer can be tested and comprises:
  a flip-flop adapted to receive said waveform signal and said first clock signal and to generate a first output signal;
    a latch in parallel with said flip-flop and adapted to receive said waveform signal and said first clock signal and to generate a second output signal;
    an AND gate adapted to receive said first output signal and a test mode signal from a test mode pin and to generate a third output signal; and
    a multiplexer adapted to gate said third output signal, said second output signal, and said first clock signal in order to generate said second clock signal such that when said test mode signal and said first clock signal are both low said second clock signal is low.

2. The integrated circuit device according to claim 1, all the limitations of which are incorporated herein by reference, wherein said latch comprises a level-sensitive latch.

3. The integrated circuit device according to claim 1, all the limitations of which are incorporated herein by reference, further comprising a second multiplexer connected between said waveform generator and said flip-flop, wherein said second multiplexer is adapted to gate said waveform signal, a scan input signal and a test scan enable signal.

4. The integrated circuit device according to claim 1, all the limitations of which are incorporated herein by reference, further comprising an OR gate that is connected between one of said state machine and said latch and said latch and said first multiplexer and that is adapted to receive a test clock enable signal so as to override all other gating.

5. The integrated circuit device according to claim 1, all the limitations of which are incorporated herein by reference, having an edge-sensitive multiplexer scan design clocked by said second clock signal.

6. An integrated circuit device comprising:
  a finite state machine adapted to generate a first waveform signal and a second waveform signal, wherein said finite state machine is clocked by a first clock signal; and
  a deskewer circuit adapted to receive and gate said first waveform signal, said second waveform signal and said first clock signal so as to generate a second clock signal such that said second clock signal is synchronously linked to said first clock signal, wherein said deskewer comprises:
    a flip-flop adapted to receive said first waveform signal and said first clock signal and to generate a first output signal;
    a latch in parallel with said flip-flop and adapted to receive said second waveform signal and said first clock signal and to generate a second output signal;
    an AND gate adapted to receive said first output signal and a test mode signal from a test mode pin and to generate a third output signal; and
    a multiplexer adapted to gate said third output signal, said second output signal, and said first clock signal in order to generate said second clock signal such that when said test mode signal and said first clock signal are both low said second clock signal is low.

7. The integrated circuit device according to claim 6, all the limitations of which are incorporated herein by reference, wherein said latch comprises a level-sensitive latch.

8. The integrated circuit device according to claim 6, all the limitations of which are incorporated herein by reference, further comprising a second multiplexer connected between said finite state machine and said flip-flop, wherein said second multiplexer is adapted to gate said first waveform signal, a scan input signal and a test scan enable signal.

9. The integrated circuit device according to claim 6, all the limitations of which are incorporated herein by reference, further comprising an OR gate that is connected between one of said state machine and said latch and said latch and said first multiplexer and that is adapted to receive a test clock enable signal so as to override all other gating.

10. The integrated circuit device according to claim 6, all the limitations of which are incorporated herein by reference, having an edge-sensitive multiplexer scan design clocked by said second clock signal.

11. An integrated circuit device comprising:
  a deskewer circuit adapted to receive and gate a first clock signal and at least one waveform signal so as to generate a second clock signal such that said second clock signal is synchronously linked to said first clock signal, wherein said deskewer can be tested and comprises:
    a flip-flop adapted to receive a first waveform signal and said first clock signal and to generate a first output signal;
    a latch in parallel with said flip-flop and adapted to receive a second waveform signal and said first clock signal and to generate a second output signal,
    wherein said first waveform signal and said second waveform signal comprise one of a same waveform signal that is split and different waveform signals;
    an AND gate adapted to receive said first output signal and a test mode signal from a test mode pin and to generate a third output signal; and
    a multiplexer adapted to gate said third output signal, said second output signal, and said first clock signal in order to generate said second clock signal such that when said test mode signal and said first clock signal are both low said second clock signal is low.

12. The integrated circuit device according to claim 11, all the limitations of which are incorporated herein by reference, wherein said latch comprises a level-sensitive latch.

13. The integrated circuit device according to claim 11, all the limitations of which are incorporated herein by reference, further comprising a second multiplexer connected between said waveform generator and said flip-flop, wherein said second multiplexer is adapted to gate said waveform signal, a scan input signal and a test scan enable signal.

14. The integrated circuit device according to claim 11, all the limitations of which are incorporated herein by reference, further comprising an OR gate that is connected between one of said state machine and said latch and said latch and said first multiplexer and that is adapted to receive a test clock enable signal so as to override all other gating.

15. The integrated circuit device according to claim 11, all the limitations of which are incorporated herein by reference, having an edge-sensitive multiplexer scan design clocked by said second clock signal.

* * * * *